United States Patent [19]

Jenq

[11] Patent Number: 4,763,105
[45] Date of Patent: Aug. 9, 1988

[54] INTERLEAVED DIGITIZER ARRAY WITH CALIBRATED SAMPLE TIMING

[75] Inventor: Yih-Chyun Jenq, Lake Oswego, Oreg.

[73] Assignee: Tektronix, Inc., Beaverton, Oreg.

[21] Appl. No.: 71,671

[22] Filed: Jul. 8, 1987

[51] Int. Cl.$^4$ .............................................. H03M 1/06
[52] U.S. Cl. ........................ 340/347 AD; 340/347 SH
[58] Field of Search ................. 340/347 AD, 347 CC, 340/347 SH

[56] References Cited

U.S. PATENT DOCUMENTS 4,345,241  8/1982  Takeuchi et al. ............ 340/347 CC Primary Examiner—William M. Shoop, Jr.
Assistant Examiner—Richard K. Blum
Attorney, Agent, or Firm—Daniel J. Bedell; Robert S. Hulse

[57] ABSTRACT

A digitizer system includes M digitizers, each producing a separate waveform data sequence representing a succession of instantaneous magnitudes of an input signal at sample times determined by a periodic clock signal. Transmission of the clock signal to each digitizer is delayed by a corresponding adjustable delay time so as to control the relative sample timing of the digitizers. To adjust sample timing, a sine wave signal is applied as the input signal to each digitizer such that the M digitizers produce M separate waveform data sequences in response to said input signal and the M data sequences are interleaved and windowed to form a single waveform data sequence. A first sequence of complex numbers representing a discrete Fourier transform of the single waveform data sequence is generated and then a second sequence of M complex numbers is formed from elements corresponding to relative magnitude peaks of the first sequence. A third sequence of M complex numbers is generated representing an inverse discrete Fourier transform of the second sequence and the phase angle of each number of the third sequence is computed and divided by the input signal frequency to produce a set of M numbers, each representing a timing error for a corresponding one of the M digitizers. The time delay corresponding to each digitizer is then adjusted by the amount of the timing error.

12 Claims, 5 Drawing Sheets

INTERLEAVED DIGITIZER ARRAY WITH CALIBRATED SAMPLE TIMING

BACKGROUND OF THE INVENTION

The present invention relates in general to a high speed waveform digitizer system of the type which employs a parallel array of digitizers to sample and digitize a waveform at successive times, and in particular to a method and apparatus for measuring and adjusting the time interval between successive waveform samples.

A typical waveform digitizer employs a sample and hole (S/H) circuit to sample and store a voltage representing the instantaneous magnitude of an input signal and an analog-to-digital (A/D) converter which produces digital output data proportional to the sample voltage, thereby representing the instantaneous magnitude of the input signal. The sampling rate of such a digitizer is usually limited by the rate at which the A/D converter can convert the sample voltage to a stable digital value.

Digitizer systems comprising arrays of such digitizers have been developed which can sample and digitize an input signal at a higher rate than any one digitizer can operate. The input signal is applied in parallel to each digitizer of the array. A single clock signal passes through a multiple tap delay line (or a succession of time delay circuits), each tap of the line providing the clock signal input to a successive one of the digitizers so that for each successive digitizer of the array, the clock signal is delayed by a longer time. Thus each digitizer samples and digitizes the input signal once during each cycle of the clock signal, but at a different relative time during the cycle. The sequences of output data produced by all of digitizers are collected and stored in an interleaved fashion to provide a single data sequence representative of the input signal. While the propagation delay of each A/D converter of each individual digitizer need only by slightly less than the period of the clock signal, the effective sampling rate of an array of M digitizers is M times the frequency of th clock signal.

For a clock signal of frequency $f_s/M$, each section of the delay line should delay the strobe signal by $1/f_s$ so that samples are taken at evenly spaced intervals. The resulting data sequence is then equivalent to a sequence produced by a single digitizer operating at a sampling frequency of $f_s$. The effective sampling rate of such a digitizer array (and therefore the sampling time resolution of the sampling system) can be increased by increasing the number M of digitizers in the array and the number of taps in the delay line, and decreasing the time delay between each tap of the delay line. However, the accuracy with which the delay line can be adjusted to delay the clock signal places a limit on the sampling time resolution that can be obtained. As $f_s$ increases, the delay provided by each section of the delay line decreases, and small errors in the time delay provided by each section have an increasing effect on the relative accuracy with which each sample is timed. Differences in the response time of each digitizer, which can vary with ambiemt temperature or component aging, cause additional time delay errors. When the number of digitizers reaches a point at which the time delay errors become substantial in comparison to the nominal time delay of each delay line section, an increasae in the number M of digitizers cannot substantially improve the accuracy with which the data sequence produce by the array characterizes the input signal.

SUMMARY OF THE INVENTION

A digitizer system comprises an array of M similar digitizers, each producing a separate output data sequence representing a succession of instantaneous magnitude samples of an input signal. A periodic clock signal is applied to each digitizer to control sample timing, but the clock signal is delayed by an adjustable delay time prior to application to each digitizer. When the clock signal time delay associated with each delay circuit is properly adjusted, the separate output data sequences of the digitizers may be interleaved to form a single data sequence representing magnitudes of the input signal at times which are spaced by intervals of $1/f_s$ seconds, where $f_s/M$ is the frequency of the clock signal.

In accordance with the present invention, the adjustment is performed by applying a sine wave signal of known frequency $f_o$ as the input signal to the digitizer system and permitting the digitizer system to produce an interleaved waveform data sequence comprising IM elements, where I is an integer, suitably 16. The IM elements of the data sequence are then windowed (weighted), suitably by a 4-term Blackman-Harris window, and the resulting windowed waveform data sequence is transformed by a discrete Fourier transform to produce a sequence of IM complex numbers representing a frequency spectrum of the windowed waveform sequence. A total of M elements spaced I elements apart and representing peaks of the frequency spectrum are then extracted from the frequency spectrum sequence to produce a first M-element sequence of complex numbers, which is then subjected to inverse Fourier transform to produce a second M-element sequence of complex numbers. The phase angle of each number of the second sequence is determined and divided by the frequency of the input sine wave signal. Each of the resulting M values indicates a timing error associated with a separate one of the digitizers, and the clock signal time delays are adjusted accordingly to eliminate the timing errors.

The accuracy of the timing error measurement depends only on the accuracy with which the frequency of the input sine wave signal can be controlled, and not on the amplitude of the sine wave signal. Since since wave signal generators known in the art can produce sine wave signals of accurately controllable frequency, the timing errors can be accurately measured.

It is accordingly an object of the invention to provide a method for accurately measuring sampling clock signal time delays in a digitizer system utilizing a digitizer array.

It is another object of the invention to provide a high frequency array-type digitizer system in which sample timing is accurately controlled.

The subject matter of the present invention is particularly pointed out and distinctly claimed in the concluding portion of this specification. However, both the organization and method of operation of the invention, together with further advantages and objects thereof, may best be understood by reference to the following description taken in connection with accompanying drawings wherein like reference characters refer to like elements.

DRAWINGS

DETAILED DESCRIPTION

Figure 1:
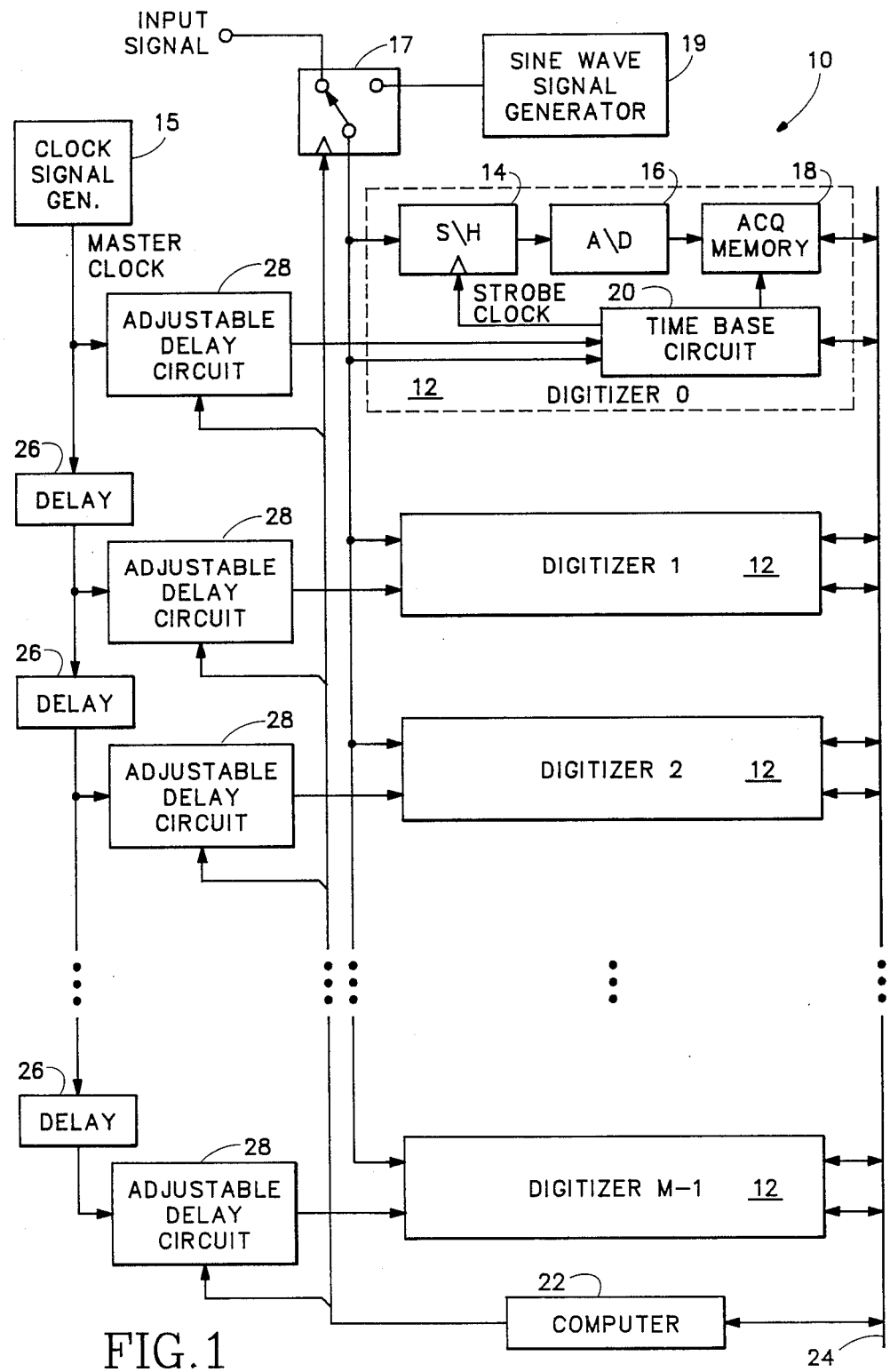
FIG. 1 is a block diagram of a digitizer system utilizing a digitizer array.

FIG. 1 shows a block diagram of a digitizer system 10 adapted to digitize an input signal with a nominal sampling frequency $f_s$. The digitizer system comprises an array of M conventional digitizers 12, each including a sample and hold (S/H) circuit 14 for capturing a voltage sample of an input signal connected to the digitizer through a switch 17 controlled by a computer 22. The S/H circuit 14 captures the voltage sample when strobed by a pulse from a strobe signal. An analog-to-digital (A/D) converter 16 converts the voltage sample to representative digital data, and an acquisition memory 18 stores the A/D converter output data. Each digitizer 12 also includes a time base circuit 20 for producing the strobe signal applied to S/H circuit 14 in response to each pulse of an externally generated clock signal. Time base circuit 20 also addresses and write enables acquisition memory 18, the memory address being incremented between each write operation. The time base circuit 20 begins strobing S/H circuit 14 in response to the first clock signal pulse following receipt of a start command from computer 22 transmitted by way of a control and data bus 24 interconnecting each digitizer 12 to computer 22. In accordance with instructions provided by computer 22 via bus 24, each time base circuit 20 may stop acquiring data after a predetermined number of data values have been stored in acquisition memory 18 or after the input signal reaches a predetermined trigger level. Digitizers capable of performing the functions of digitizers 12 are often utilized in digital oscilloscopes for digitizing input signals.

Thus each digitizer 12 is adapted to store a sequence of data in its acquisition memory 18, each element of the data sequence representing the magnitude of an input signal at a different time as determined by each pulse of an input clock signal. The clock signal applied to each digitizer 12 is derived from a master clock signal of frequency $f_s/M$ produced by a clock signal generator 15. The master clock signal passes through a series of unit delay stages 26, suitably comprising delay lines, each providing a nominal delay $1/f_s$. The master clock signal and the clock signal output of each delay stage are applied as inputs to separate adjustable delay circuits 28, and the output of each adjustable delay circuit 28 provides the clock input to a separate digitizer 12.

The delay provided by each adjustable delay circuit 28 is controlled by data supplied by computer 22, the amount of delay provided by each adjustable delay circuit being adjusted as described hereinbelow.

Figure 2:
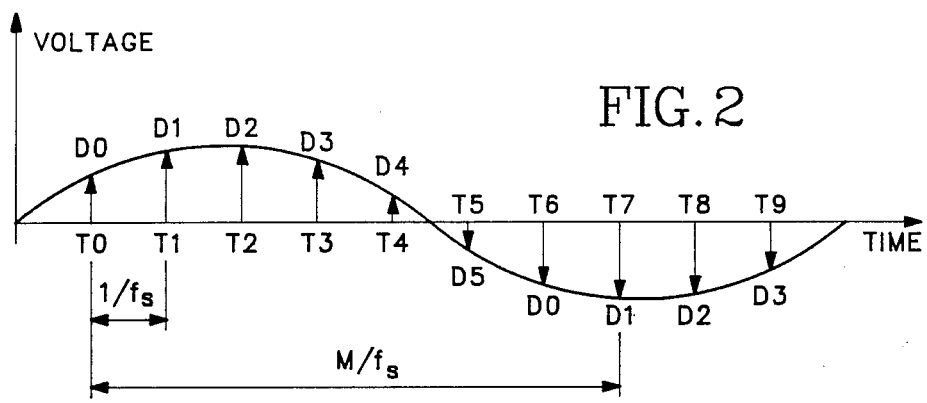
FIG. 2 is a time domain plot of a sine wave input signal to the digitizer array of FIG. 1 showing nominal sample timing.

FIG. 2 illustrates how digitizing system 10 digitizes one cycle of an input signal, for example a sine wave, when the number M of digitizers 12 is 6 and the adjustable delay circuits are adjusted such that the delay between sampling by successive digitizers 12 is $1/f_s$. At time T0, a first pulse of the master clock has propagated through one adjustable delay circuit 28 to a first digitizer 12 (Digitizer 0) and has caused Digitizer 0 to sample the input signal. The data produced and stored in the acquisition memory of Digitizer 0 in response to the voltage sample taken at time T0 is represented in FIG. 2 by the length of arrow D0 at time T0. At time T1, the same master clock pulse has propagated through one delay circuit 26 and one adjustable delay circuit 28 to a second digitizer 12 (Digitizer 1) and has caused Digitizer 1 to sample the input signal. The resulting voltage sample is subsequently digitized and stored in the acquisition memory of Digitizer 1 as data value D1. As the first master clock pulse reaches each successive Digitizer 2-5, the digitizer samples the input signal and stores a digital representation D2-D5 of the sample. At time T6, the second pulse of the master clock reaches Digitizer 0 and it acquires and stores another data sample D0. At times T7-T9, the second master clock pulse reaches Digitizers 1-3 and they acquire and store other data samples D1-D3.

Thus it may be seen that each pulse of the master clock causes each digitizer 12 to sample the input signal once, but at a different time. With the delay circuits 28 properly adjusted, the period between each sample taken by each digitizer is $M/f_s$, but the period between samples acquired by successive digitizers of the array is $1/f_s$. At the end of a data acquisition cycle, computer 22 of FIG. 1 acquires the data stored in the acquisition memory of each digitizer 12 by way of bus 24 and sequentially stores the data in an internal memory, the data being ordered in an interleaved fashion according to the relative time that each data value was acquired. Thus computer 22 assembles and stores a waveform data sequence representing the input signal which sequence is identical to a waveform data sequence that would be produced by a single conventional digitizer 12 if it could operate at a sampling frequency of $f_s$.

It is seen that an array of M digitizers, each operable at a maximum frequency of $f_s/M$, cooperate to digitize an input signal with a sampling frequency of $f_s$. However, in order for digitizer system 10 to operate properly, the time interval between samples acquired by successive digitizers must be $1/f_s$. Adjustable delay circuits 28 are needed because digitizers 12 have response times which can vary with ambient temperature and component aging. In addition, inaccuracies in delays provided by delay stages 26 and variation in lengths of various conductors or other components in the clock signal paths can also cause errors in sample timing. The adjustable delay circuits 28 permit the intervals between sampling by successive digitizer circuits to be properly adjusted to account for such sources of error.

The adjustment is made by first determining the error in each time interval. To measure the error in accordance with the present invention, a sine wave signal generator 19 is connected to an alternate input terminal of switch 17 as shown in FIG. 1, and switch 17 is operated so as to apply the output of signal generator 19 as an input signal to the digitizer system 10. Signal generator 19 produces a sine wave signal of a known, accurately controlled, frequency $f_o$. Digitizer system 10 is then operated for I cycles of the master clock such that each of the M digitizers 12 produces and stores a waveform data sequence comprising I data elements. The quantity I is an integer, suitably 16. Computer 22 then obtains and stores the M data sequences in an interleaved fashion to produce a single waveform data sequence comprising IM elements. Computer 22 then windows (weights) the IM elements of the data sequence, suitably by a 4-term Blackman-Harris window, and the resulting IM element windowed sequence is transformed by a discrete Fourier transform to produce a sequence of IM complex numbers of magnitude representative of the frequency spectrum of the windowed sequence. Every Ith element of the frequency spectrum sequence is then extracted to produce a first M-element sequence of comples numbers. The first M-element sequence is then subjected to inverse Fourier transformation to produce a second sequence of M complex numbers. The phase angle of each number of the second sequence is determined and divided by the radian frequency of the input sine wave signal. Each of the resulting M values indicates a relative timing error associated with a separate one of the digitizers, and computer 22 alters the control data supplied to each time delay circuit 28 to change the delay provided by the delay circuit by the amount of the associated timing error.

Figure 3:
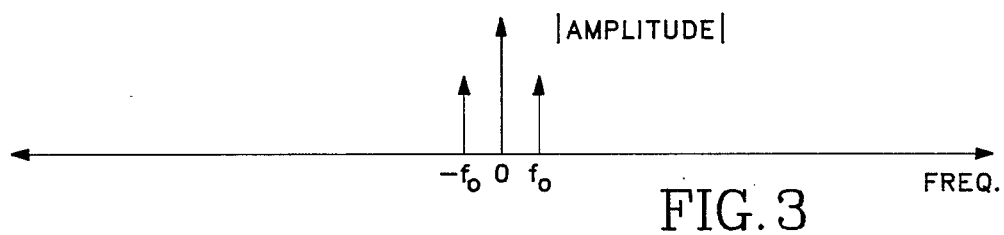
FIG. 3 is a plot of the frequency spectrum of a sine wave.
Figure 4:
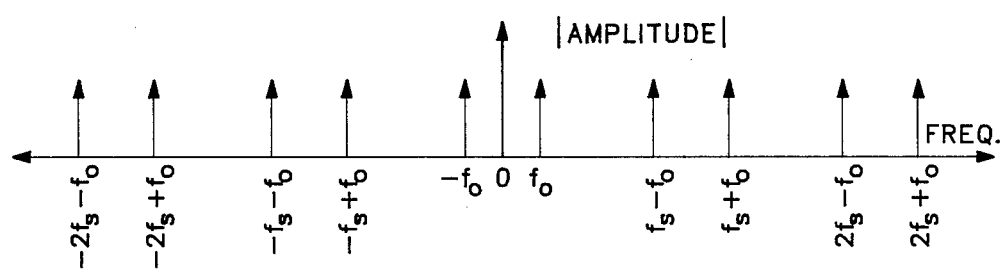
FIG. 4 is a plot of the frequency spectrum of an infinite data sequence produced by uniformly sampling and digitizing a sine wave.

FIG. 3 is a plot of the analog frequency spectrum $G^a(t)$ produced by taking the Fourier transform of a sine wave signal $g(x)$ of frequency $f_o$. The spectrum includes spectral lines represented by vertical arrows at frequencies $\pm f_o$; the absolute value of the magnitude of a signal component of frequencies indicated by the horizontal position of a spectral line is represented by its length. The discrete Fourier transform $G(w)$ of $g(x)$ is an infinite sequence of complex numbers, the absolute amplitudes of a portion of which are plotted in FIG. 4. The plot of FIG. 4 represents the convolution of the frequency spectrum of FIG. 3 with the frequency spectrum of a periodic pulse signal of frequency $f_s$. However, the digitizing system 10 of FIG. 1 produces a finite data sequence, rather than an infinite data sequence, and when the adjustable delay circuits 28 are improperly adjusted, the interval between successive samples is non-uniform. Consequently the frequency spectrum of a data sequence produced by digitizing system 10 by digitizing an input sine wave signal differs from the frequency spectrum shown in FIG. 4.

Let $g(t)$ be the analog input signal. When digitizer system 10 digitizes an input signal $g(t)$, it produces a data sequence $S = [g(t_0), g(t_1), g(t_2), \ldots, g(t_M), g(t_{M+1}), \ldots]$ comprising M interleaved subsequences $S_0, S_1, \ldots, S_{M-1}$ as follows:

$$S_0 = [g(t_0), g(t_M), g(t_{2M}), \ldots]$$

$$S_1 = [g(t_1), g(t_{M+1}), g(t_{2M+1}), \ldots]$$

$$\vdots$$

$$S_m = [g(t_m), g(t_{M+m}), g(t_{2M+m}), \ldots]$$

$$\vdots$$

$$S_{M-1} = [g(t_{M-1}), g(t_{2M-1}), g(t_{3M-1}), \ldots]$$

It is clear that the m-th subsequence $S_m$ is obtained by uniformly sampling the value $g(t+t_m)$ at the rate $1/MT$, for $T = 1/Mf_2$. To construct the sequence S, one might insert (M−1) zeroes between samples in all subsequences $S_m$, for m=0 to M−1, i.e., $$\overline{SHD}\, m = [g(t_m), 0, 0, \ldots (M-1 \text{ zeroes}), g(t_{M+m}), 0, 0, \ldots]$$

and then shift the subsequences $\overline{SHD}\, m$ m positions to the right, for m=0 to M−1, i.e., $$\overline{SHD}\, m z^{-m} = [(m \text{ zeroes}), g(t_m), (M-1 \text{ zeroes}), g(t_{M+m}), \ldots]$$

where $z^{-1}$ is the unit delay operator, and finally sum up all the subsequences to obtain the original sequence, $$S = \sum_{m=0}^{M-1} \overline{S}_m z^{-m}. \tag{1}$$

The digital spectrum, $G(w)$, of S can then be represented by summation of those of $\overline{SHD}\, mz^{-m}$, for m=0 to M−1, $$G(w) = (1/MT) \sum_{m=0}^{M-1} \sum_{k=-\infty}^{\infty} G^a[w - k(2\pi/MT)] \tag{2}$$

$$e^{j[w - k(2\pi/MT)]t_m} e^{-jmwT}.$$

Let $r_m$ be the ratio of $mT - t_m$ to the average sampling period T, i.e., let $$t_m = mT - r_m T. \tag{3}$$

Then equation (2) may be rewritten as $$G(w) = (1/T) \sum_{k=-\infty}^{\infty} (1/M) \sum_{m=0}^{M-1} e^{-j[w-k(2\pi/MT)]r_m T} \tag{4}$$

$$e^{-jkm(2\pi/M)} G^a[w - k(2\pi/MT)].$$

Equations (2) and (4) are two general representations of the digital spectrum of a non-uniformly sampled signal.

For a sinusoidal input signal $g(t) = e^{jw_o t}$ of frequency $f_o$ where $w_o = 2\pi f_o$, the Fourier transform is given by $$G^a(w) = 2\pi \delta(w - w_o) \tag{5}$$

where $\delta$ is the delta function.

Substituting equation (5) into equation (4), we have $$G(w) = (1/MT) \sum_{m=0}^{M-1} \sum_{k=-\infty}^{\infty} 2\pi \delta[w - w_o - k(2\pi/MT)] \tag{6}$$

$$e^{-jrm 2\pi f_o/f_s} e^{-jkm(2\pi/M)}$$

where $f_s$ is the average sampling frequency $1/T$. Let us define a sequence $A(k)$, k=0, 1, 2, ..., M−1, M, ... as follows, $$A(k) = \sum_{m=0}^{M-1} [1/M e^{-jrm 2\pi f_o/f_s}] e^{-jkm(2\pi/M)}. \tag{7}$$

Then we can rewrite equation (6) as $$G(w) = (1/T) \sum_{k=-\infty}^{\infty} A(k) 2\pi \, \delta[w - w_o - k(2\pi/MT)]. \tag{8}$$

Equations (7) and (8) are the complete spectral representation of a non-uniformly sampled sinusoidal signal.

Figure 5:
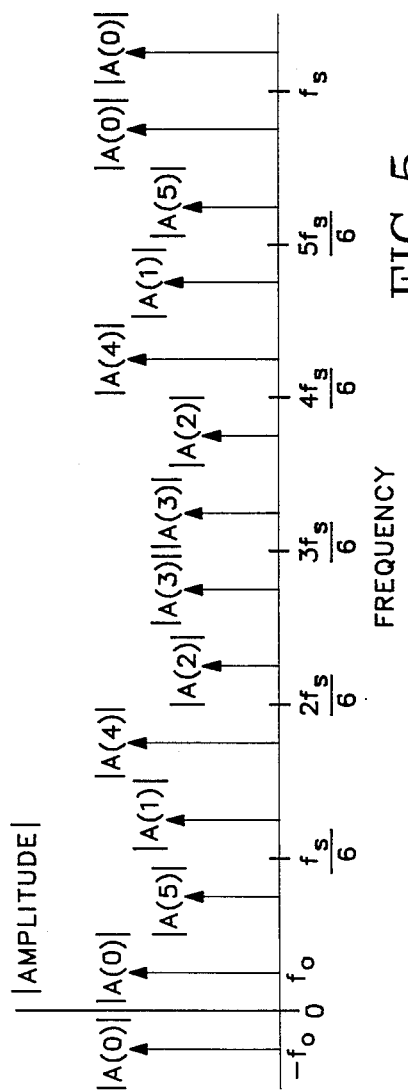
FIG. 5 is a plot of the frequency spectrum of an infinite data sequence produced by nonuniformly sampling and digitizing a sine wave.

FIG. 5 shows a portion of the frequency spectrum of an infinite data sequence acquired by an $M=6$ digitizer array in response to a sine wave input signal of frequency $f_o=f_s/4M$. From equation (7) it is seen that the sequence A(k) is periodic on k with the period M, hence the spectrum G(w) given by equation (8) is periodic on w with the period equal to $2\pi/T=2\pi f_s$, i.e., the average sampling radian frequency. Furthermore, one period of the spectrum comprises M line spectra uniformly spaced on the frequency axis f, with neighboring spectral lines separated by the amount of $f_s/M$. The main signal component is located at $f_o$ and with magnitude proportional to $|A(0)|$, while the m-th harmonic component is located at $f_o+(m/M)f_s$ and has magnitude proportional to $|A(m)|$. It is also noted that the relative strength among different harmonics as represented by $|A(k)|$'s are exaggerated in FIG. 5 to indicated that all A(k)'s are, in general, different; however, in practice where $r_m$ is small, from equation (7), $|A(k)| \approx |A(M-k)|$. From equation (8) it should be noted that for each value of k there is only one value of w for which the delta function is non-zero. In other words, G(w) is equal to $f_s A(k)$ for one particular value of k.

It is noted from equation (7) that the finite sequence [A(k), k=0, 1, ..., M−1] is the discrete Fourier transform of the sequence $$[(1/M)e^{-jrm2\pi f_o/f_s}], m=0, 1, \ldots, M-1].$$

Given an IM-element sequence of complex numbers representing the spectrum G(w) of equation (8), one could extract elements thereof to form an M-element sequence $[w_s A(k), k=0, 1, \ldots M-1]$. For example, for a sequence representing the spectrum shown in FIG. 5, one might extract sequence elements representing $G(f_o)$, $G(f_s/6+f_o)$, ..., $G(5f_s/6+f_o)$ to produce sequence $w_s$ [A(0), A(1), A(2), A(3), A(4), A(5)]. By taking the discrete inverse Fourier transform of this sequence, we obtain the sequence $$w_s[e^{-jrm2\pi f_o/f_s}, m=0, 1, \ldots, M-1].$$

If we then compute the phase angle of each element of this sequence we have the sequence:

$$[2\pi r_m f_o/f_s, m=0, 1, \ldots, M-1].$$

Dividing each element of the above sequence by $2\pi f_o$ and noting that $T=1/f_s$, we obtain the sequence:

$$[r_m T, m=0, 1, \ldots, M-1].$$

Since $r_m T$ represents the time delay error of the Mth adjustable delay circuit 28 of FIG. 1, this sequence indicates the amount by which each adjustable delay circuit must be adjusted.

Thus one might determine the adjustment error of each adjustable delay circuit 28 of FIG. 1 by applying a sine wave input signal of frequency $f_o$ to the digitizer system, taking the discrete Fourier transform of the resulting sequence, extracting the sequence proportional to A(k) for k=0, 1, ..., M−1, finding the phase angle of each element of the sequence and dividing each phase angle by $2\pi f_o$. However, the above described method assumes that the data sequence representing the input signal is of infinite length, whereas the data sequence produced by digitizer system 10 of FIG. 1 is of finite length. One may think of the waveform data sequence produced by system 10 as representing sampled values of a waveform representing the product of a rectangular function and the input signal, the rectangular function having a unit value for a time interval T and zero value before and after the interval. The frequency spectrum of the rectangular function, shown in FIG. 6, includes a major lobe of width 2/T centered about zero frequency and multiple side lobes of decreasing magnitude.

Figure 6:
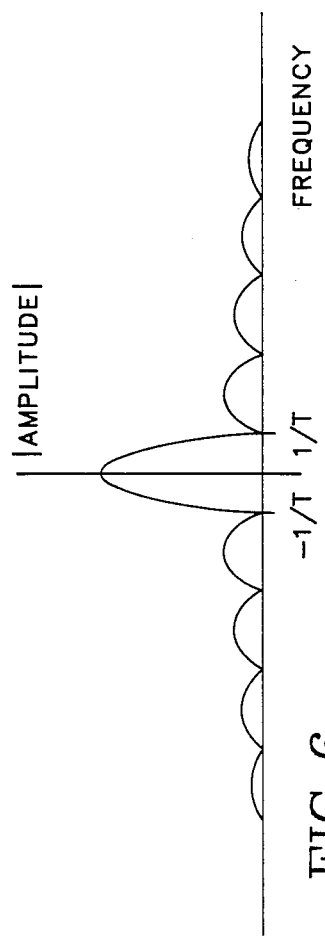
FIG. 6 is a plot of the frequency spectrum of a rectangular function.

The frequency spectrum of the finitie "truncated" data sequence produced by digitizer system 10 would therefore not appear as a series of discrete spectral lines as shown in FIG. 5, but would appear as the convolution of the spectrum of FIG. 5 with the spectrum of FIG. 6. By windowing (weighting terms of) a rectangular function, suitably with a four-term Blackman-Harris window, the amplitude of the side lobes of the spectrum of FIG. 6 can be substantially reduced. The Blackman-Harris window and other windowing functions are described in the article "On the Use of Windows for Harmonic Analysis with Discrete Fourier Transform", by Fredric J. Harris, in *Proceedings of the IEEE*, Vol. 66, No. 1, January 1974, which article is incorporated herein by reference.

Figure 7:
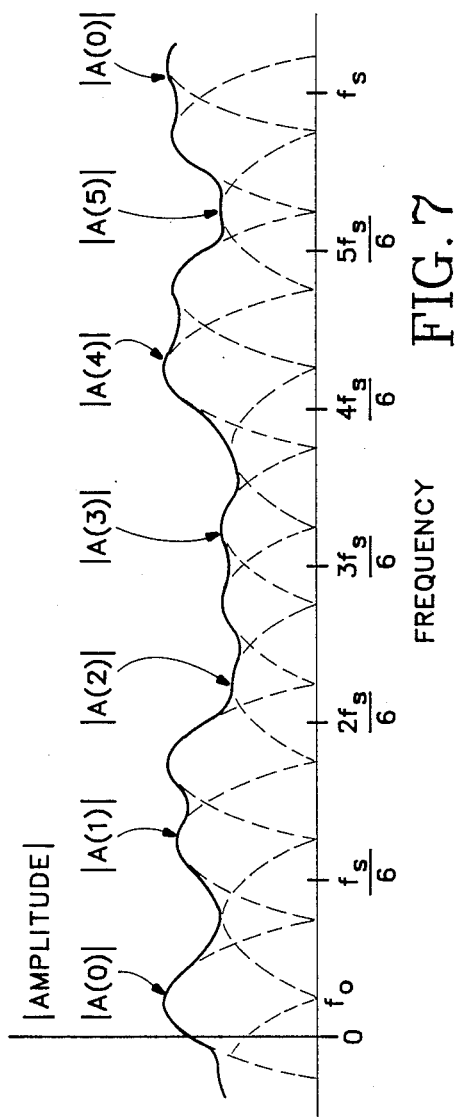
FIGS. 7 and 8 are plots of the frequency spectrum of a data sequence produced by windowing a truncated, non-uniformly sampled sinewave.
Figure 8:
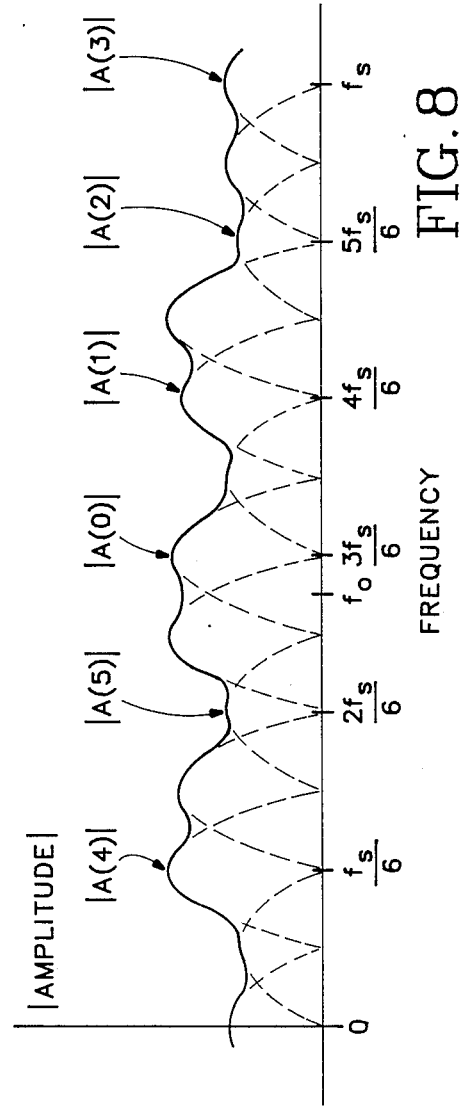

FIG. 7 shows a frequency spectrum produced by taking the discrete Fourier transform of a waveform data sequence acquired by digitizer system 10 of FIG. 1 when M=6, and where the input signal is a sine wave of frequency $f_o=f_s/24$ and the resulting sequence has been windowed by a Blackman-Harris window. The absolute value of the amplitude function A(f) has been plotted on a logarithmic scale along the vertical axis and frequency f is plotted along the horizontal axis. Major lobe pairs (shown in dotted line) are centered about the frequency of each spectrum line of FIG. 5 and have an amplitude equivalent to the amplitude of the corresponding spectrum line of FIG. 5. (Minor lobes are so small as to be negligible and are therefore not shown in FIG. 7.) The 4-term Blackman-Harris window is chosen for its low side-lobe and easy implementation. However, this window has a somewhat larger main lobe than other popular windows. In order to avoid the interference from neighboring main lobes the input test frequency must be at least $(1/4M)f_s$ away from $(m/M)f_s$, where m=1, 2, ... . M, in one direction and at least $(3/4M)f_s$ away from those frequencies in the other direction. Hence at least 16M data points are needed. The absolute magnitude of each data sequence element of the transformed, windowed sequence is shown in FIG. 8 as a heavy line comprising the sum of the functions shown in dotted line.

Since the waveform data sequence produced by system 10 of FIG. 1 includes 16M elements representing the input waveform g(t), a 16M element sequence of complex numbers representing a frequency spectrum of the input signal is produced by windowing the waveform data sequence with the Blackman-Harris window and taking the discrete Fourier transform of the result. With M=6, the sequence includes $16 \times 6 = 96$ complex numbers, each number representing a separate value G(f) where f=0, $f_s/64$, $2f_s/64$, ..., $63f_s/64$. The fourth number of the sequence of 96 complex numbers represents $G(4f_s/96)=G(f_o)$ and is equal to $w_s A(0)$. Similarly the (16k+4)th number of the sequence represents $G(4kf_s/96)$ which is equal to $w_s A(k)$. Thus an M-element sequence $w_s[A(m), m=0, 1, \ldots, M-1]$ may be extracted from the 96-element frequency spectrum sequence by choosing the 4th element of the frequency spectrum sequence and every 16th element thereafter. The timing error sequence $[r_m T\ m=0, 1, \ldots, M-1]$ can then be obtained by determining the phase angle of each element $w_s A(m)$ as described hereinabove.

If the waveform data sequence were not windowed, the minor lobes associated with each major lobe shown in FIG. 7 would not be negligible and would adversely affect the values of A(k) obtained and therefore the computed values of $r_m T$ would be less accurate. The windowing function could have been chosen to provide greater than or less than 50% overlap of the major lobes as shown in FIG. 7. However with greater than 50% overlap, the data values of G(f) which correspond to peak values of the lobes and which represent values of A(k), would be more strongly affected by adjacent major lobes. With less than 50% overlap spectral resolution is decreased.

The frequency $f_o$ of the test signal should not be greater than half the sampling frequency $f_o$ in order to avoid aliasing. In addition, in order to ensure that spectral peaks are evenly spaced and appear at frequencies corresponding to data points of the transformed, windowed data sequence G(f), $f_o$ should be selected to satisfy the following relation:

$$f_o = (f_s/n) - f_s/4M \quad (n=1, 2, 3, \ldots) \qquad [10]$$

In the example of FIG. 8, n=12 which gives $f_o = f_s/24$. However, since the timing errors $r_m T$ are computed from the phase angles $(2\pi r_m f_o/f_s)$, to maximize the resolution with which the phase angles are determined, it is desirable to make $f_o$ as large as possible so that the phase angles will be as large as possible. To do so it is necessary to choose n as small as possible. If n=1, then from equation [10], $f_o = 23 f_s/24$. But to avoid aliasing $f_o$ must be not greater than $f_s 2$. Choosing n=2, from equation [10] gives $f_o = 11\ f_s/24$, which is less than half $f_s$. Therefore the choice of n=2 in equation 10 gives the sine wave signal frequency providing the best resolution in the determination of timing errors $r_m T$.

FIG. 8 shows the frequency spectrum of the windowed Fourier transform of a data sequence acquired from an M=6 digitizer array acting on an input sinewave of frequency $f_o = 11 f_s/24$. The frequency spectrum is similar to that shown in FIG. 7, but has been shifted to the left by $10 f_s/24$. As in the case of the frequency spectrum of FIG. 7, the sequency $w_s A(m)$ may be obtained by extracting the 4th frequency spectrum sequence number and every 16th number thereafter, but the resulting sequence is $w_s[A(4), A(5), (A(0), A(1), A(2), A(3)]$ which must be reordered to obtain the sequence $w_s A(m)$, m=0 to 5.

Figure 9:
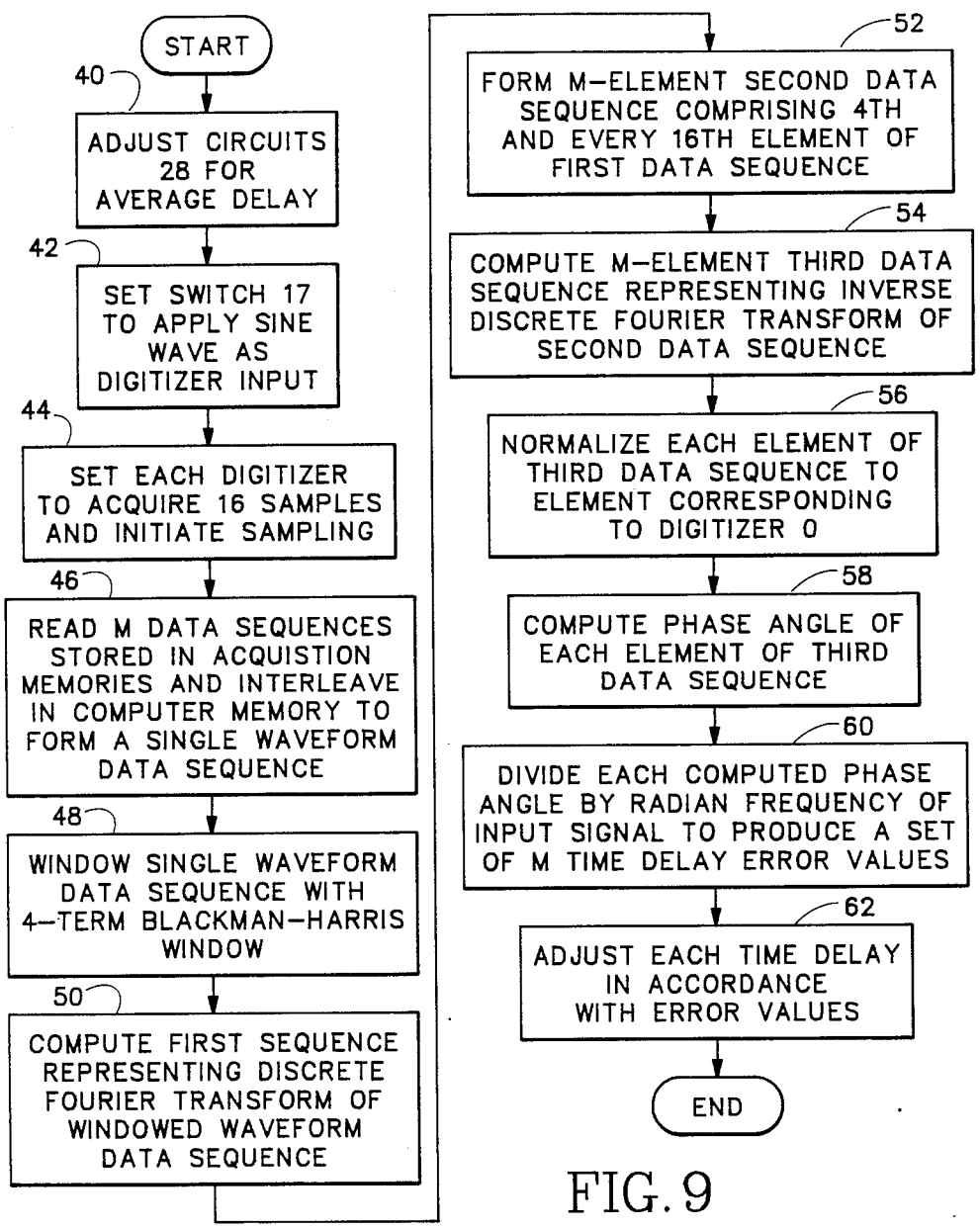
FIG. 9 is a flow chart for programming the computer of FIG. 1 in accordance with the present invention.

FIG. 9 is a flow chart for programming computer 22 of FIG. 1 to measure and adjust the time delay circuits 28 of digitizer 10. Starting in step 40, delay circuits 28 of FIG. 1 are adjusted to provide an average delay, midway between minimum and maximum. Switch 17 is set to apply the sine wave output of sinewave signal generator 19 as the input signal to digitizer system 10 (step 42). Each digitizer 12 is set to digitize 16 samples of the input signal, and data acquisition is initiated (step 44). After the digitizers 12 have each acquired and stored sequences of 16 data values in their acquisition memories, computer 22 reads the data sequences and interleaves them in memory to form a single 96 element waveform data sequence (step 46) which is then windowed by a 4-term Blackman-Harris window (step 48).

The discrete Fourier transform of the windowed sequence is then computed (step 50) to form a first data sequence, and a second data sequence of M elements is formed by extracting the 4th element of the first sequence and every 16th element thereafter (step 52). A third data sequence comprising M complex numbers is then computed (step 54) by taking the inverse discrete Fourier transform of the second data sequence. Each element of the third data sequence may then be normalized to the element corresponding to k=0, i.e., the element having a phase angle from which the error associated with Digitizer 0 is computed (step 56). The phase angle of each element of the third data sequence is computed (step 58) and then divided by the radian frequency of the sine wave input signal (step 60) to produce the set of M time delay error values. Computer 22 then adjusts each time delay circuit 28 in accordance with the error values. It should be noted that the normalizing step (step 56), may be eliminated. However, the normalizing step obviates the need to adjust the delay circuit 28 associated with Digitizer 0.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

I claim:

1. For a digitizer system comprising an array of M digitizers each responsive to an input signal and a periodic clock signal of known frequency, where M is an integer greater than 1, and means for delaying transmission of the clock signal to each digitizer by a separate delay time corresponding to said each digitizer, each digitizer comprising means for producing a separate waveform data sequence in response to the clock signal, each data element of the separate waveform data sequence representing an instantaneous magnitude of the input signal during each period of said clock signal, a method for determining a timing error in the delay time corresponding to each digitizer, the method comprising the steps of:

applying a sine wave signal of known frequency as the input signal to each digitizer such that the M digitizers produce M separate waveform data sequences in response to said input signal and said clock signal;

generating a single waveform data sequence in accordance with a combination of the M separate waveform data sequences, the single waveform data sequence being representative of said input signal;

generating a first sequence of complex numbers representing a frequency spectrum of the single waveform data sequence;

generating a second sequence of M complex numbers by extracting M elements representing relative magnitude peaks of the first sequence;

generating a third sequence of M complex numbers representing an inverse discrete Fourier transform of the second sequence;

generating a set of M phase angle numbers, each phase angle number representing a phase angle associated with a separate complex number of the third sequence and corresponding to a separate one of said digitizers; and determining a sample timing error for each digitizer in accordance with the corresponding phase angle.

2. The method in accordance with claim 1 wherein the step of generating a single waveform data sequence in accordance with a combination of the M separate waveform data sequences comprises the substeps of:
interleaving elements of the M data sequences to form an interleaved data sequence; and
windowing with a windowing function the interleaved data sequence to form said single waveform data sequence.

3. The method in accordance with claim 1 wherein said sine wave signal has a frequency not greater than one half the frequency of said clock signal.

4. The method in accordance with claim 3 wherein said clock signal has a frequency $f_s$ and said sine wave signal has a frequency $f_o$ satisfying the expression $$f_o = (f_s/n) - (f_s/4M)$$

where n is selected from among the set of all integers greater than 1.

5. The method in accordance with claim 3 wherein said clock signal has a frequency $f_s$ and said sine wave signal has a frequency $f_o$ satisfying the expression $$f_o = (f_s/2) - (f_s/4M).$$

6. The method in accordance with claim 1 wherein the step of determining a sample timing error for each digitizer in accordance with the corresponding phase angle comprises the substep of dividing the corresponding phase angle by an amount proportional to the frequency of said input signal.

7. For a digitizer system comprising an array of M digitizers each responsive to an input signal and a periodic clock signal of known frequency $f_s$, where M is an integer greater than 1, and means for delaying transmission of the clock signal to each digitizer by a separate delay time corresponding to said each digitizer, each digitizer comprising means for producing a separate waveform data sequence in response to the clock signal, each data element of the separate waveform data sequence representing an instantaneous magnitude of the input signal during each period of said clock signal, a method for determining a timing error in the delay time corresponding to each digitizer, the method comprising the steps of:
applying a sine wave signal of known frequency $f_o$ as the input signal to each digitizer such that the M digitizers produce M separate waveform data sequences in response to said input signal and said clock signal, where $f_o$ satisfies the expression $f_o = (f_s/n) - (f_s/4M)$ where n is selected from among the set of all integers greater than 1;
interleaving elements of the M data sequences to form a single interleaved data sequence representative of said input signal;
windowing the interleaved data sequence to form a windowed waveform data sequence;
generating a first sequence of complex numbers representing a discrete Fourier transform of the single waveform data sequence;
generating a second sequence of M complex numbers comprising M elements of said first sequence corresponding to relative magnitude peaks of the first sequence;
generating a third sequence of M complex numbers representing an inverse discrete Fourier transform of the second sequence;
generating a set of M phase angle numbers, each phase angle number representing a phase angle associated with a separate complex number of the third sequence and corresponding to a separate one of said digitizers; and
determining a sample timing error for each digitizer in accordance with the corresponding phase angle number.

8. The method in accordance with claim 7 wherein said sine wave signal has a frequency $f_o$ of frequency satisfying the expression $$f_o = (f_s/2) - (f_s/4M).$$

9. The method in accordance with claim 7 wherein the step of determining a sample timing error for each digitizer in accordance with the corresponding phase angle number comprises the substep of dividing the corresponding phase angle number by an amount proportional to the frequency of said input signal.

10. A self-calibrating digitizer system comprising:
an array of M digitizers each responsive to an input signal and a periodic clock signal of known frequency, where M is an integer greater than 1, each digitizer comprising means for producing a separate waveform data sequence in response to the clock signal, each data element of the separate waveform data sequence representing an instantaneous magnitude of the input signal during each period of said clock signal;
means for delaying transmission of the clock signal to each digitizer by an adjustable delay time corresponding to said each digitizer;
means for generating a sine wave signal of known frequency for application as the input signal to each digitizer such that the M digitizers produce M separate waveform data sequences in response to said input signal and said clock signal; and
means responsive to said M separate waveform data sequences for generating a single waveform data sequence in accordance with a combination of said M separate waveform data sequences, the single waveform data sequence being representative of said input signal, for generating a first sequence of complex numbers representing a frequency spectrum of the single waveform data sequence, for generating a second sequence of complex numbers by extracting M elements representing relative magnitude peaks of the first sequence, for generating a third sequence of M complex numbers in accordance with an inverse discrete Fourier transform of the second sequence, for generating a set of M phase angle numbers, each phase angle number representing a phase angle associated with a separate complex number of the third sequence and corresponding to a separate one of said digitizers, for determining a timing error corresponding to each digitizer in accordance with the corresponding phase angle number, and for adjusting the adjustable delay time corresponding to each digitizer in accordance with the timing error corresponding to each digitizer.

11. A self-calibrating digitizer system comprising:
an array of M digitizers each responsive to an input signal and a periodic clock signal of known frequency $f_s$, where M is an integer greater than 1, each digitizer comprising means for producing a separate waveform data sequence in response to the clock signal, each data element of the separate waveform data sequence representing an instantaneous magnitude of the input signal during each period of said clock signal;

means for delaying transmission of the clock signal to each digitizer by a corresponding delay time;

means for generating a sine wave signal of known frequency $f_o$ as the input signal to each digitizer such that the M digitizers produce M separate waveform data sequences in response to said input signal and said clock signal, where $f_o$ satisfies the expression $f_o = (f_s/n) - (f_s/4M)$ with n is selected from among the set of all integers greater than 2; and means for interleaving elements of the M data sequences to form a single interleaved data sequence representative of said input signal, for windowing the interleaved data sequence to form a windowed waveform data sequence, for generating a first sequence of complex numbers representing a discrete Fourier transform of the single waveform data sequence, for generating a second sequence of M complex numbers by extracting M elements representing relative magnitude peaks of the first sequence, for generating a third sequence of M complex numbers representing an inverse discrete Fourier transform of the second sequence, for generating a set of M phase angle numbers, each phase angle number representing a phase angle associated with a separate complex number of the third sequence and corresponding to a separate one of said digitizers, for determining a timing error for each digitizer in accordance with the corresponding phase angle number, and for adjusting the adjustable delay time corresponding to each digitizer in accordance with the corresponding timing error.

12. The self-calibrating digitizer system in accordance with claim 11 wherein said sine wave signal has a frequency $f_o$ satisfying the expression $$f_o = (f_s/n) - (f_s/4M),$$

where n is an integer greater than 1.

* * * * *